United States Patent
Moon

(10) Patent No.: US 7,394,872 B2
(45) Date of Patent: Jul. 1, 2008

(54) DATA RECEIVER AND METHOD FOR RECEIVING DATA USING FOLDED DIFFERENTIAL VOLTAGE SAMPLER

(75) Inventor: Byong-Mo Moon, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 998 days.

(21) Appl. No.: 10/205,646

(22) Filed: Jul. 24, 2002

(65) Prior Publication Data

US 2003/0058046 A1 Mar. 27, 2003

(30) Foreign Application Priority Data

Sep. 27, 2001 (KR) ............................. 2001-60025

(51) Int. Cl.
*H04L 25/10* (2006.01)
*H03K 5/22* (2006.01)
*H03F 3/45* (2006.01)

(52) U.S. Cl. ..................... 375/318; 327/89; 327/287; 330/253

(58) Field of Classification Search ................ 375/244, 375/247, 316, 318; 327/52, 56, 89, 96, 266, 327/280, 287; 330/252, 253, 257; 341/143
See application file for complete search history.

(56) References Cited

U.S. PATENT DOCUMENTS

| | | | |
|---|---|---|---|
| 5,355,391 A | 10/1994 | Horowitz et al. | |
| 6,052,026 A * | 4/2000 | Tiller et al. | 330/254 |
| 6,072,366 A * | 6/2000 | Maeda et al. | 330/254 |
| 6,137,306 A | 10/2000 | Hirata et al. | |
| 6,160,423 A | 12/2000 | Haq | |
| 6,396,329 B1 * | 5/2002 | Zerbe | 327/336 |
| 6,480,548 B1 * | 11/2002 | Mansur | 375/242 |
| 6,498,530 B1 * | 12/2002 | Tang | 330/9 |
| 6,937,664 B1 * | 8/2005 | Park et al. | 375/259 |
| 2002/0041649 A1 * | 4/2002 | Zielbauer | 375/371 |

FOREIGN PATENT DOCUMENTS

KR 2000-0000522 1/2000

OTHER PUBLICATIONS

English language Abstract of Korean Patent No. 2000-0000522, filed Jan. 6, 2000.

* cited by examiner

*Primary Examiner*—Young T. Tse
(74) *Attorney, Agent, or Firm*—Marger Johnson & McCollom, P.C.

(57) ABSTRACT

A data receiver that is capable of precisely detecting data at high speed even at a high frequency after receiving differential reference signals and data in synchronization with a clock signal, and a method for receiving data, are provided. The receiver includes an amplifier which compares differential reference signals with input data and outputs first differential reference signals based on the results of the comparison; and a folded differential voltage sensor which amplifies the difference between the first differential signals in synchronization with a clock signal and detects the input data.

15 Claims, 7 Drawing Sheets

DATA RECEIVER AND METHOD FOR RECEIVING DATA USING FOLDED DIFFERENTIAL VOLTAGE SAMPLER

CROSS-REFERENCE TO RELATED APPLICATION

This application claims priority from Korean Patent Application No. 2001-0060025 Filed Sep. 27, 2001 in the Korean Intellectual Property Office, the disclosure of which is incorporated herein in its entirety by reference.

BACKGROUND OF THE INVENTION

1. Field of the Invention

The present disclosure relates to a semiconductor device, and more particularly, to a data receiver which uses a folded differential voltage sampler operating in synchronization with a clock signal and can detect data in a differential signal manner by receiving a data line and differential reference signals, and a method for receiving data.

2. Description of the Related Art

Methods for transmitting and receiving data to and from a semiconductor device at high speed include a method for differentially transmitting and receiving. This method, however, requires many data lines or data input/output pins.

FIG. 1A is a block diagram of a conventional data receiver using a single reference signal. FIG. 1B is a timing diagram illustrating the waveforms of signal lines shown in FIG. 1. Referring to FIGS. 1A and 1B, a data receiver 10 includes a single reference signal line 1, through which a reference signal VREF is received, and N data lines 3, 5, . . . , 7, through which N data signals DATA1, DATA2, . . . , DATAN are received. The data receiver 10 compares the reference VREF with each of N data DATA1, DATA2, . . . , DATAN and detects the received data DATA1, DATA2, . . . , DATAN.

However, since the data receiver 10 uses a single reference signal, it is sensitive to noise and thus has difficulty receiving data at high speed. In addition, as the transmission of data becomes faster, the level of data becomes smaller due to an attenuation effect of transmission lines. Accordingly, the difference DD1 in voltage between the reference signal VREF and a data signal DATAi continues to decrease, making it more difficult for the data receiver 10 to precisely detect the data signal DATAi.

FIG. 2A is a block diagram of a conventional receiver using a differential signal. FIG. 2B is a timing diagram illustrating the waveforms of data lines shown in FIG. 2A. Referring to FIGS. 2A and 2B, a receiver 20 using a differential signal includes 2N data lines 11, 13, . . . , 15, 17, through which 2N data signals DATA1, /DATA1, . . . , DATAN,/DATAN are received. Here, the data signals DATA1 and /DATA1 are complementary signals.

In the case of the data receiver 20, the difference DD2 in voltage between a data signal DATAi and its complementary data signal /DATAi can be equal to the voltage difference DD1 in a single reference signal receiver 10. Thus, it is possible to decrease the swing width of the data signal DATAi and the power consumption of the data receiver 20 and thus receive data at high speed. However, the data receiver 20 needs twice as many data lines than the data receiver 10 adopting a single reference signal.

In the case of a data receiver disclosed in U.S. Pat. No. 6,160,423, ('423) the trip point of two inverters may vary according to variations in process, voltage, and temperature, and thus it is impossible to precisely detect data input into the data receiver. In addition, when the output levels of comparators are very low, the data receiver cannot precisely detect data.

When the data receiver disclosed in the '423 patent operates at a high frequency, it cannot precisely detect data, and glitches may occur during the operation of switches. Finally, since the data receiver disclosed in the '423 patent uses exclusive OR (XOR) logic gates, the layout area of the data receiver is increased.

SUMMARY OF THE INVENTION

To solve the above-described problems, it is a first object of the present invention to provide a data receiver that receives differential reference signals and data in synchronization with a clock signal, and can precisely detect the received data at high speed even at a high frequency, and a method for receiving data.

It is a second object of the present invention to provide a data receiver that which can precisely detect data even when data having a low signal level is input into the data receiver, and a method for receiving data.

To achieve the above objects, there is provided a receiver according to a first embodiment of the present invention, including an amplifier which compares differential reference signals with input data and outputs first differential reference signals based on the results of the comparison; and a folded differential voltage sensor which amplifies the difference between the first differential signals in synchronization with a clock signal and detects the input data.

It is preferable that the differential reference signals are direct current (DC) signals or oscillating signals. The folded differential voltage sensor may include a sensor which senses the difference between the first differential signals in synchronization with the clock signal and outputs second differential signals based on the results of the sensing; an amplifier which precharges the levels of first and second nodes to a power supply voltage, amplifies the difference between the second differential signals to generate third differential signals, and outputs the third differential signals to the first and second nodes; and a latch which latches the output signal of the first node and the output signal of the second node.

Embodiments of the present invention provides a receiver including a first differential amplifier which compares a first reference signal with input data and outputs first differential signals based on the results of the comparison; a second differential amplifier which compares a second reference signal with the input data and outputs second differential signals based on the results of the comparison; and a folded differential voltage sense amplifier which amplifies the difference between the first differential signals or between the second differential signals in synchronization with a clock signal to detect the input data, wherein the first and second reference signals are differential signals.

It is preferable that the first reference signal is input into a first input port of the first differential amplifier via a first transmission line, the second reference signal is input into a first input port of the second differential amplifier via a second transmission line, and the input data is input into a second input port of the first differential amplifier and a second input port of the second differential amplifier via a third transmission line.

Preferably, the folded differential voltage sense amplifier includes: a sensor which senses the difference between the first differential signals or between the second differential signals in synchronization with the clock signal and outputs third differential signals based on the results of the sensing; an amplifier which precharges the levels of first and second nodes to a power supply voltage in synchronization with the clock signal, amplifies the difference between the third differential signals to generate fourth differential signals, and outputs the fourth differential signals to the first and second nodes; and a latch which latches the output signal of the first node and the output signal of the second node.

To achieve the above objects, there is provided a receiver according to a second embodiment of the present invention, the receiver including a sensor which compares differential reference signals with input data in synchronization with a clock signal and outputs first differential signals based on the results of the comparison; an amplifier which precharges the levels of first and a second nodes to a power supply voltage in synchronization with the clock signal, amplifies the difference between the first differential signals to generate second differential signals, and outputs the second differential signals to the first and second nodes; and a latch which latches the output signal of the first node and the output signal of the second node.

To achieve the above objects, there is provided a method for receiving data, according to the first embodiment of the present invention, the method including: comparing differential reference signals with input data and outputting first differential signals based on the results of the comparison; and detecting the input data by amplifying the difference between the first differential signals in synchronization with a clock signal.

It is preferable that the method for detecting the input data includes sensing the difference between the first differential signals in synchronization with the clock signal and outputting second differential signals based on the results of the sensing; precharging the levels of first and second nodes to a power supply voltage in synchronization with the clock signal, amplifying the difference between the second differential signals to generate third differential signals, and outputting the third differential signals to the first and second nodes; and latching the output signal of the first node and the output signal of the second node.

To achieve the above objects, there is provided a method for receiving data according to the present invention, the method including comparing differential reference signals with input data in synchronization with a clock signal and outputting first differential signals based on the results of the comparison; precharging the levels of first and second nodes to a power supply voltage in synchronization with the clock signal, amplifying the difference between the first differential signals to generate second differential signals, and outputting the second differential signals to the first and second nodes; and latching the output signal of the first node and the output signal of the second node.

BRIEF DESCRIPTION OF THE DRAWINGS

The above objects and advantages of the present invention will become more apparent by describing in detail preferred embodiments thereof with reference to the attached drawings, in which.

DETAILED DESCRIPTION OF THE INVENTION

Figure 1A:
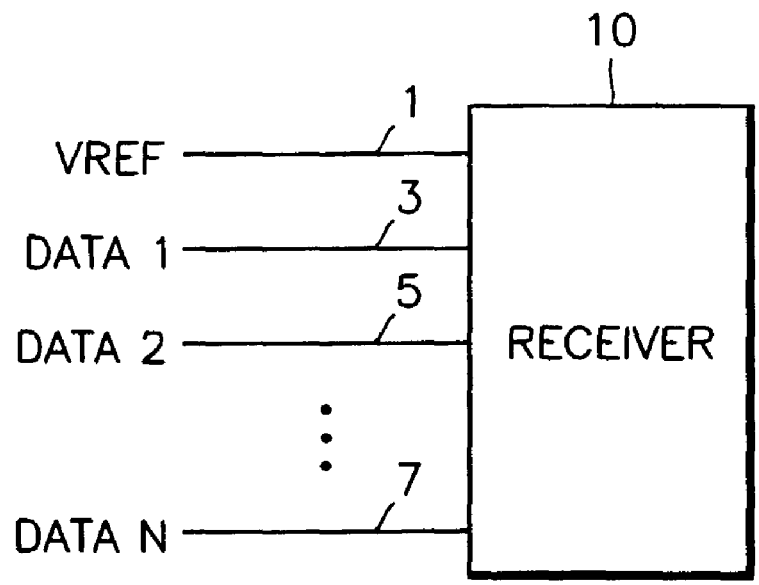
FIG. 1A is a block diagram of a conventional data receiver using a single reference signal.
Figure 1B:
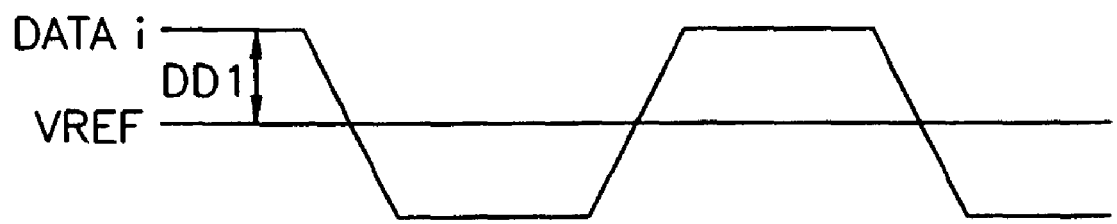
FIG. 1B is a timing diagram illustrating the waveforms of signal lines shown in FIG. 1A.
Figure 2A:
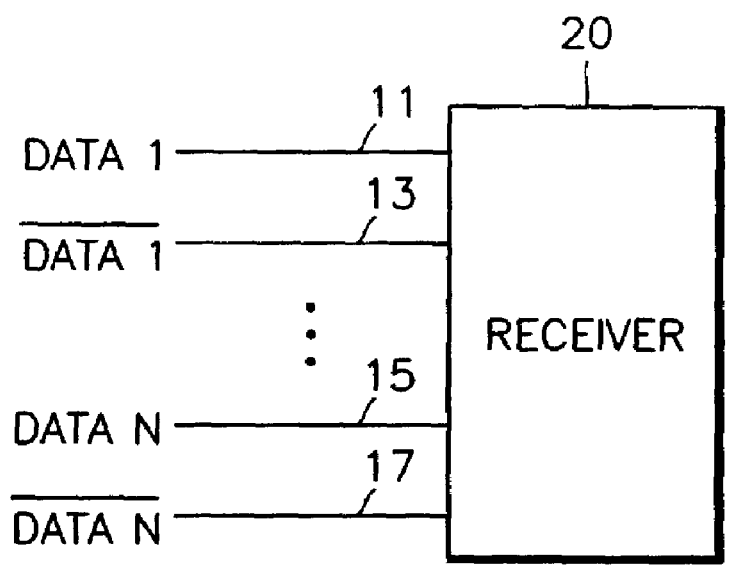
FIG. 2A is a block diagram of a conventional data receiver using a differential signal.
Figure 2B:
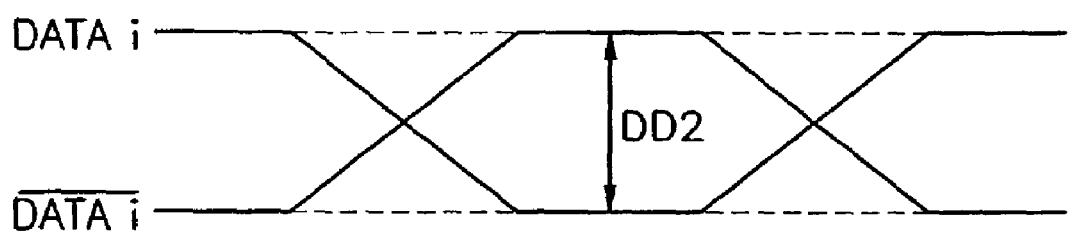
FIG. 2B is a timing diagram illustrating the waveforms of signal lines shown in FIG. 2A.

Embodiments of the present invention will now be described more fully with reference to the accompanying drawings, in which preferred embodiments of the invention are shown. The same reference numerals in different drawings represent the same elements.

Figure 3:
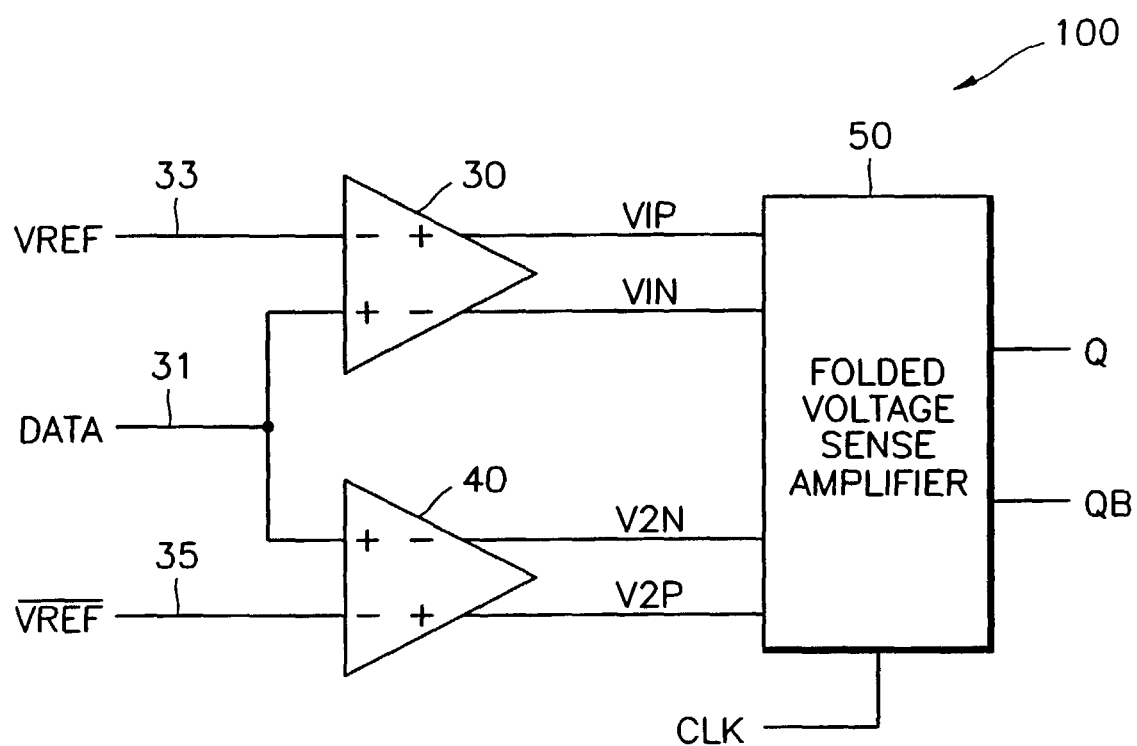
FIG. 3 is a circuit diagram of a data receiver according to a first embodiment of the present invention.

FIG. 3 is a circuit diagram of a data receiver according to a first embodiment of the present invention. For the convenience of explanation, this example uses only a single data signal, and thus the data receiver 100 of FIG. 3 includes a data line 31, through which one data signal DATA is received, and reference signal lines 33 and 35, through which differential reference signals VREF and /VREF, respectively, are received. The differential reference signals VREF and /VREF are preferably oscillating or direct current (DC) signals.

A data receiver which can precisely detect N (where N is a natural number, for example, N=16) data signals at high speed in synchronization with a clock signal needs reference signal lines, through which differential reference signals are received, and N data lines, through which the N data signals are received, and can be easily realized based on the embodiments of the present invention.

Referring to FIG. 3, the data receiver 100 includes a first pre amplifier 30, a second pre amplifier 40, and a voltage sense amplifier 50. The voltage sense amplifier 50 is preferably a folded voltage sense amplifier and serves as a folded differential voltage sampler.

The first pre amplifier 30 compares the first reference signal VREF input into a first input port via the signal transmission line 33 with the data signal DATA input into a second input port via the signal transmission line 31, and outputs a first output signal V1P and a second output signal V1N to the voltage sense amplifier 50 via a first output port and a second output port, respectively, based on the results of the comparison. The first and second output signals V1P and V1N are complementary signals or differential signals.

For example, if the level of the first reference signal VREF is higher than the level of the data signal DATA, the first pre amplifier 30 outputs the second output signal V1N and the first output signal V1P having a lower level than the second output signal V1N to the voltage sense amplifier 50.

If the level of the first reference signal VREF is lower than the level of the data signal DATA, the first pre amplifier 30 outputs the second output signal V1N and the first output signal V1P having a higher level than the second output signal V1N to the voltage sense amplifier 50.

If the level of the first reference signal VREF is the same as the level of the data signal DATA, the first pre amplifier 30 outputs the first output signal V1P and the second output signal V1N at the same level.

The second pre amplifier 40 compares the second reference signal /VREF input into a third input port via the signal transmission line 35 with the data signal DATA input into a fourth input port via the signal transmission line 31, and outputs a third output signal V2P and a fourth output signal V2N to the voltage sense amplifier 50 via a third output port and a fourth output port, respectively, based on the results of the comparison. The third and fourth output signals V2P and V2N are preferably complementary signals.

For example, if the level of the second reference signal /VREF is higher than the level of the data signal DATA, the second pre amplifier 40 outputs the fourth output signal V2N and the third output signal V2P having a lower level than the fourth output signal V2N to the voltage sense amplifier 50.

If the level of the second reference signal /VREF is lower than the level of the data signal DATA, the second pre amplifier 40 outputs the fourth output signal V2N and the third output signal V2P having a higher level than the fourth output signal V2N.

If the level of the second reference signal /VREF is the same as the level of the data signal DATA, the second pre amplifier 40 outputs the third output signal V2P and the fourth output signal V2N at the same level.

Preferably, the first and second reference signals VREF and /VREF are complementary reference signals, and the data signal DATA is a single-ended signal. In addition, when the first and second reference signals VREF and /VREF oscillate, the first reference signal VREF is preferably synchronized with the data signal DATA.

The voltage sense amplifier 50 senses and amplifies the output signals of the first and second pre amplifiers 30 and 40 in response to a clock signal CLK and outputs the results. The voltage sense amplifier 50 will be described in greater detail with reference to FIG. 5.

Figure 4:
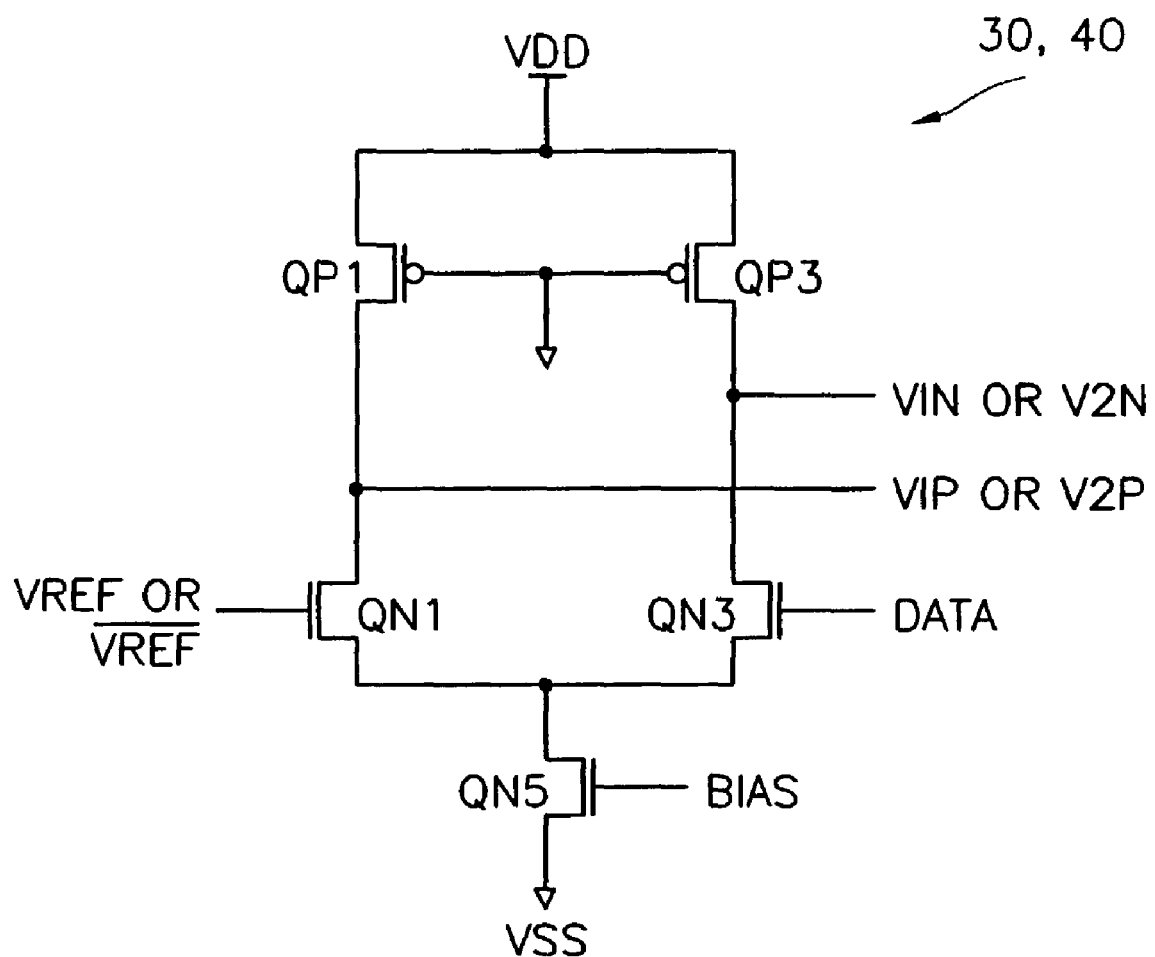
FIG. 4 is a circuit diagram illustrating a first pre amplifier and a second pre amplifier shown in FIG. 3.

FIG. 4 is a circuit diagram illustrating the first and second pre amplifiers 30 and 40 shown in FIG. 3. As shown in FIG. 4, the first and second pre amplifiers 30 and 40 each include two load transistors QP1 and QP3, two gating transistors QN1 and QN3, and a current source transistor QN5.

Preferably, the current source transistor QN5 of each of the first and second pre amplifiers 30 and 40 operates in a saturation region in response to a predetermined bias (BIAS) so as to be less affected by common mode variations.

Figure 5:
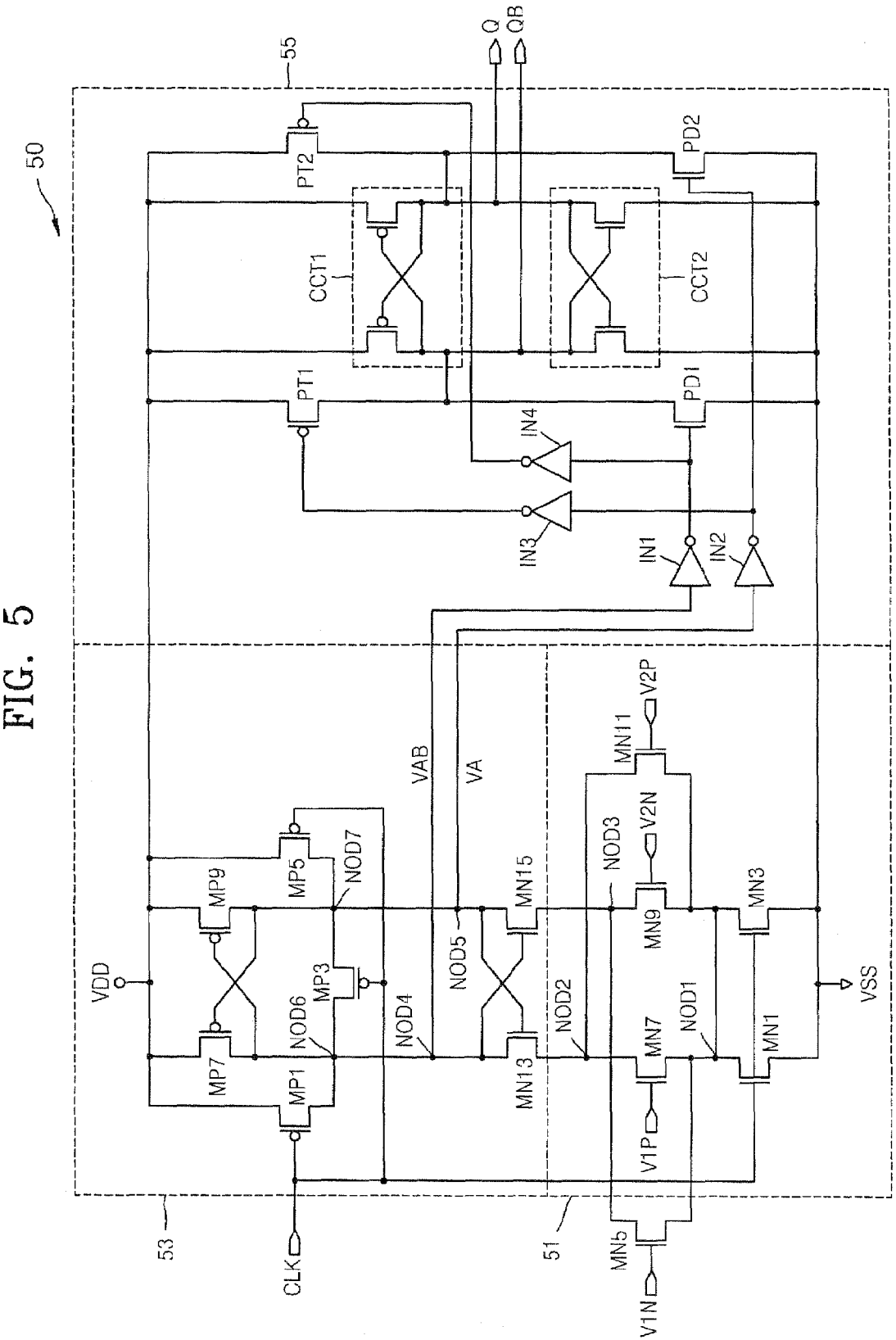
FIG. 5 is a circuit diagram of a voltage sense amplifier shown in FIG. 3.

FIG. 5 is a circuit diagram of the voltage sense amplifier 50 shown in FIG. 3. Referring to FIG. 5, the voltage sense amplifier 50 includes a sensor 51, an amplifier 53, and a latch 55. The sensor 51 has a structure in which a clock signal CLK is input to the gates of transistors MN1 and MN3 each having their drain connected to a first node NOD1 and their source connected to ground VSS.

The second output signal V1N is input into the gate of a transistor MN5, which has its drain connected to a third node NOD3 and its source connected to the first node NOD1. The first output signal V1P is input into the gate of a transistor MN7, which has its drain connected to a second node NOD2 and its source connected to the first node NOD1.

The fourth output signal V2N is input into the gate of a transistor MN9, which has its drain connected to the third node NOD3 and its source connected to the first node NOD1. The third output signal V2P is input into the gate of a transistor MN11, which has its drain connected to the second node NOD2 and its source connected to the first node NOD1.

The sensor 51 senses the difference between the output signals V1P and V1N of the first pre amplifier 30 or between the output signals V2P and V2N of the second pre amplifiers 40 and outputs the results to the second and third nodes NOD2 and NOD3. The output signals of the second node NOD2 and the third node NOD3 are differential signals.

The amplifier 53 includes PMOS transistors MP7 and MP9 cross-coupled to each other, NMOS transistors MN13 and MN15 cross-coupled to each other, and equalization transistors MP1, MP3, and MP5 for equalizing a fourth node NOD4 and a fifth node NOD5.

The equalization transistors MP1, MP3, and MP5 equalize the levels of the fourth and fifth nodes NOD4 and NOD5 to a power supply voltage VDD level in response to inactivation of the clock signal CLK (the logic 'low' state of the clock signal CLK).

The PMOS transistor MP7 has its gate connected to a seventh node NOD7, its source connected to the power supply voltage VDD, and its drain connected to a sixth node NOD6. The PMOS transistor MP9 has its gate connected to the sixth node NOD6, its source connected to the power supply voltage VDD, and its drain connected to the seventh node NOD7.

The equalization transistor MP1 pulls up the level of the sixth node NOD6 to the power supply voltage VDD in response to the clock signal CLK. The equalization transistor MP5 pulls up the level of the seventh node NOD7 to the power supply voltage VDD in response to the clock signal CLK. The equalization transistor MP3 equalizes the levels of the sixth and seventh nodes NOD6 and NOD7 to the power supply voltage VDD in response to the clock signal CLK.

The NMOS transistor MN13 has its gate connected to the fifth node NOD5, its drain connected to the fourth node NOD4, and its source connected to the second node NOD2. The NMOS transistor MN15 has its gate connected to the fourth node NOD4, its drain connected to the fifth node NOD5, and its source connected to the third node NOD3.

The output signal VAB of the fourth node NOD4 and the output signal VA of the fifth node NOD5 are full-swung between the power supply voltage VDD and the ground VSS, and are differential signals.

The latch 55 includes four inverters IN1 through IN4, two transistors CCT1 and CCT2 cross-coupled to each other, two pull-up transistors PT1 and PT2, and two pull-down transistors PD1 and PD2, and latches the output signal VAB of the fourth node NOD4 and the output signal VA of the fifth node NOD5.

Figure 6:
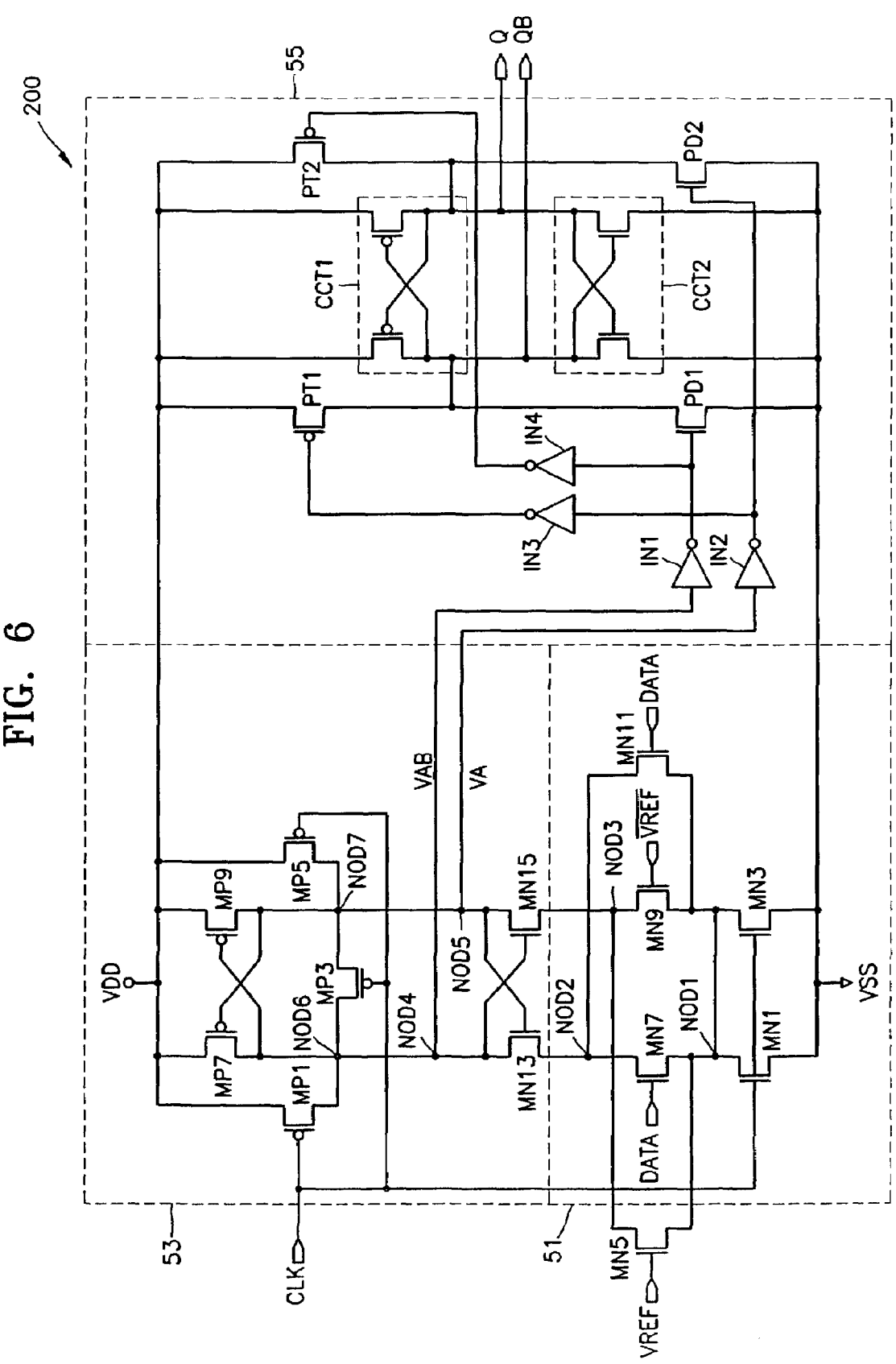
FIG. 6 is a circuit diagram of a data receiver according to a second embodiment of the present invention.

FIG. 6 is a circuit diagram of a data receiver according to a second embodiment of the present invention. Referring to FIG. 6, a data receiver 200 includes a sensor 51, an amplifier 53, and a latch 55. The data receiver 200 is preferably a folded voltage sense amplifier.

The sensor 51 has a structure in which a clock signal CLK is input to the gates of transistors MN1 and MN3 each having their drain connected to a first node NOD1 and their source connected to ground VSS.

A first reference signal VREF is input into the gate of a transistor MN5, which has its drain connected to a third node NOD3 and its source connected to the first node NOD1. A data signal DATA is input into the gate of a transistor MN7, which has its drain connected to a second node NOD2 and its source connected to the first node NOD1.

A second reference signal /VREF is input into the gate of a transistor MN9 which has its drain connected to the third node NOD3 and its source connected to the first node NOD1. The data signal DATA is input into the gate of a transistor MN11 which has its drain connected to the second node NOD2 and its source connected to the first node NOD1.

The sensor 51 senses the difference between the data signal DATA and the first reference signal VREF or the second reference signal /VREF, and outputs the results to the second and third nodes NOD2 and NOD3. The first and second reference signals VREF and /VREF are differential signals, and the output signals of the second node and third nodes NOD2 and NOD3 are differential signals.

The structure and operation of the amplifier 53 and the latch 55 shown in FIG. 6 are the same as those of the amplifier 53 and the latch 55 shown in FIG. 5, and thus their descriptions will not be repeated here. In other words, the data receiver 200 of FIG. 6 receives the first reference signal VREF, the second reference signal /VREF, and the data signal DATA, and samples the received data signal DATA.

Figure 7:
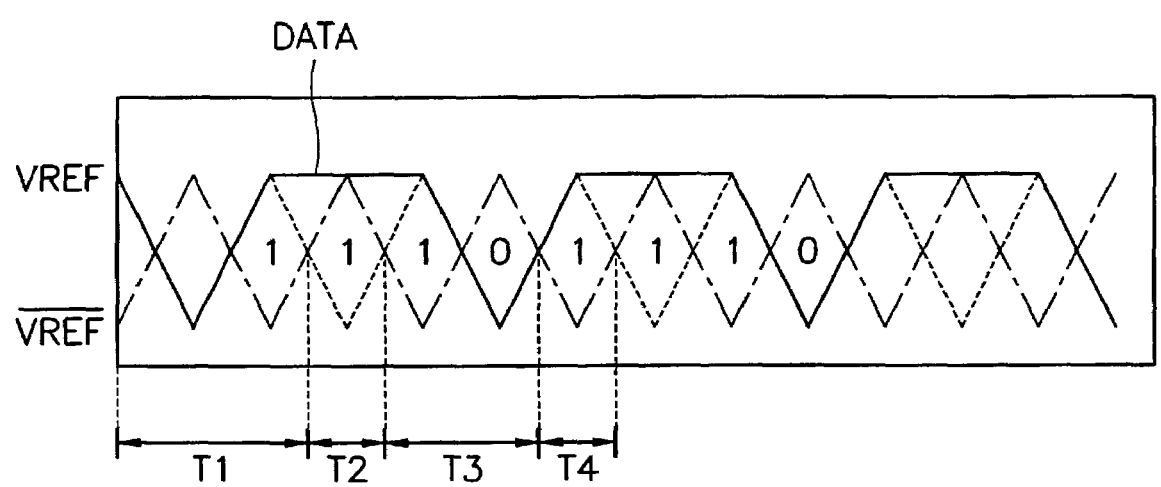
FIG. 7 is a timing diagram illustrating the waveforms of a first reference signal VREF, a second reference signal /VREF, and a data signal DATA.

FIG. 7 is a timing diagram illustrating the waveforms of the first and second reference signals VREF and /VREF and the data signals DATA. Referring to FIG. 7, the first and second reference signals VREF and /VREF oscillate in complement to each other.

The operation of the data receiver 100 will be described more fully with reference to FIGS. 3, 5, and 7. When the difference in level between the data signal DATA and the second reference signal /VREF is greater than the difference in level between the data signal DATA and the first reference signal VREF, as shown in sections T1 and T3 of FIG. 7, the operation of the second pre amplifier 40 of FIG. 3 dominates over the operation of the first pre amplifier 30 of FIG. 3. Accordingly, the second pre amplifier 40 senses the difference in level between the second reference signal /VREF and the data signal DATA and outputs the third output signal V2P and the fourth output signal V2N.

For example, if the level of the second reference signal /VREF is higher than the level of the data signal DATA, the second pre amplifier 40 outputs the fourth output signal V2N and the third output signal V2P having a lower level than the fourth output signal V2N to the voltage sense amplifier 50.

The amplifier 53 of FIG. 5 precharges the levels of the fourth and fifth nodes NOD4 and NOD5 to the power supply voltage VDD in response to inactivation of the clock signal CLK. Then, the transistors MN9 and MN11 sense the difference in level between the third output signal V2P and the fourth output signal V2N in response to the third and fourth output signals V2P and V2N.

Here, since the level of the output signal of the second node NOD2 is higher than the level of the output signal of the third node NOD3, the transistor MN15 pulls down the voltage VA at the fifth node NOD5 to the ground VSS level. Accordingly, the transistor MN13 is turned off, and thus the voltage VAB at the fourth node NOD4 is maintained at the power supply voltage VDD. The latch 55 latches an output signal Q that is logic 'low' and an inverted output signal QB that is logic 'high'.

However, if the level of the second reference signal /VREF is lower than the level of the data signal DATA, the second pre amplifier 40 outputs the fourth output signal V2N and the third output signal V2P having a higher level than the fourth output signal V2N to the voltage sense amplifier 50.

The amplifier 53 of FIG. 5 precharges the levels of the fourth and fifth nodes NOD4 and NOD5 to the power supply voltage VDD in response to inactivation of the clock signal CLK. The transistors MN9 and MN11 of the sensor 51 sense the difference in level between the third output signal V2P and the fourth output signal V2N in response to the third and fourth output signals V2P and V2N.

Here, since the level of the output signal of the second node NOD2 is lower than the level of the output signal of the third node NOD3, the transistor MN13 pulls down the voltage VAB at the fourth node NOD4 to the ground VSS level. Accordingly, the transistor MN15 is turned off, and thus the voltage VA at the fifth node NOD5 is maintained at the power supply voltage VDD. The latch 44 latches an output signal Q that is logic 'high' and an inverted output signal QB that is logic 'low'.

If the level of the second reference signal is the same as the level of the data signal DATA, the latch 55 outputs an output signal Q and an inverted output signal QB of the same logic value.

In sections T2 and T4, the difference in level between the data signal DATA and the first reference signal VREF is larger than the difference in level between the data signal DATA and the second reference signal /VREF, and thus the operation of the first pre amplifier 30 dominates over the operation of the second pre amplifier 40. Accordingly, the first pre amplifier 30 senses the difference in level between the first reference signal VREF and the data signal DATA, and outputs the first output signal V1P and the second output signal V1N.

For example, if the level of the first reference signal VREF is higher than the level of the data signal DATA, the first pre amplifier 30 outputs the second output signal V1N and the first output signal V1P having a lower level than the first output signal V1N to the voltage sense amplifier 50.

The amplifier 53 precharges the levels of the fourth and fifth nodes NOD4 and NOD5 to the power supply voltage VDD, in response to inactivation of the clock signal CLK. The transistors MN5 and MN7 of the sensor 51 sense the difference in level between the first output signal V1P and the second output signal V1N in response to the first and second output signal V1P and V1N.

Here, since the level of the output signal of the second node NOD2 is higher than the level of the output signal of the third node NOD3, the transistor MN15 pulls down the voltage VA at the fifth node NOD5 to the ground VSS level. Accordingly, the transistor MN13 is turned off, and thus the voltage VAB at the fourth node NOD4 is maintained at the power supply voltage VDD. The latch latches an output signal Q that is logic 'low' and an inverted output signal QB that is logic 'high'.

However, if the level of the first reference signal VREF is lower than the level of the data signal DATA, the first pre amplifier 30 outputs the second output signal V1N and the first output signal V1P having a higher level than the second output signal V1N to the voltage sense amplifier 50.

The amplifier 53 of FIG. 5 precharges the levels of the fourth and fifth nodes NOD4 and NOD5 to the power supply voltage VDD in response to inactivation of the clock signal CLK. The transistors MN5 and MN7 of the sensor 51 sense the difference in level between the first output signal V1P and the second output signal V1N in response to the first and second output signals V1P and V1N.

Here, since the level of the output signal of the second node NOD2 is lower than the level of the output signal of the third node NOD3, the transistor MN13 pulls down the voltage VAB at the fourth node NOD4 to the ground VSS level. Accordingly, the transistor MN15 is turned off, and thus the voltage VA at the fifth node NOD5 is maintained at the power supply voltage VDD. The latch 55 latches an output signal Q that is logic 'high' and an inverted output signal QB that is logic 'low'.

If the level of the first reference signal VREF is the same as the level of the data signal DATA, the latch 55 latches an output signal Q and an inverted signal QB of the same logic value.

Hereinafter, the operation of the data receiver 200 will be described more fully with reference to FIGS. 6 and 7. In sections T1 and T3 shown in FIG. 7, the difference in level between the data signal DATA and the second reference signal /VREF is larger than the difference in level between the data signal DATA and the first reference signal VREF, and thus the operation of the transistors MN9 and MN11 dominates over the operation of the transistors MN5 and MN7.

The operation of the transistors MN9 and MN11 and the operation of the amplifier 53 in response to inactivation of the clock signal CLK will be described in the following. The levels of the fourth and fifth nodes NOD4 and NOD5 of the amplifier 53 are precharged to the power supply voltage VDD.

If the level of the second reference signal /VREF is higher than the level of the data signal DATA, the level of the output signal of the second node NOD2 is higher than the level of the output signal of the third node NOD3. Thus, the transistor MN15 pulls down the voltage VA at the fifth node NOD5 to the ground VSS level. Accordingly, the transistor MN13 is turned off, and thus the voltage VAB at the fourth node NOD4 is maintained at the power supply voltage VDD. The latch 55 latches an output signal Q that is logic 'low' and an inverted output signal QB that is logic 'high'.

However, if the level of the second reference signal /VREF is lower than the level of the data signal DATA, the level of the output signal of the second node NOD2 is lower than the level of the output signal of the third node NOD3. Thus, the transistor MN13 pulls down the voltage VAB at the fourth node NOD4 to the ground VSS level. Accordingly, the transistor MN15 is turned off, and thus the voltage VA at the fifth node NOD5 is maintained at the power supply voltage VDD. The latch latches an output signal Q that is logic 'high' and an inverted output signal QB that is logic 'low'.

If the level of the first reference signal VREF or the second reference signal /VREF is the same as the level of the data signal DATA, the latch 55 outputs an output signal Q and an inverted output signal QB which have the same logic value.

In sections T2 and T4 shown in FIG. 7, the difference in level between the data signal DATA and the first reference signal VREF is larger than the difference in level between the data signal DATA and the second reference signal /VREF. Thus, the operation of the transistors MN5 and MN7 dominates over the operation of the transistors MN9 and MN11.

For example, if the level of the first reference signal VREF is higher than the level of the data signal DATA, the level of the output signal of the second node NOD2 is higher than the level of the output signal of the third node NOD3. Thus, the transistor MN15 pulls down the voltage VA at the fifth node NOD5 to the ground VSS level. Accordingly, the transistor MN13 is turned off, and thus the voltage VAB at the fourth node NOD4 is maintained at the power supply voltage VDD. The latch 55 latches an output signal Q that is logic 'low' and an inverted output signal QB that is logic 'high'.

However, if the level of the first reference signal VREF is lower than the level of the data signal DATA, the level of the output signal of the second node NOD2 is lower than the level of the output signal of the third node NOD3. Thus, the transistor MN13 pulls down the voltage VAB at the fourth node NOD4 to the ground VSS level. Accordingly, the transistor MN15 is turned off, and thus the voltage VA at the fourth node NOD4 is maintained at the power supply voltage VDD. Thus, the latch 55 latches an output signal Q that is logic 'high' and an inverted output signal QB that is logic 'low'.

If the level of the first reference signal VREF or the second reference signal /VREF is the same as the level of the data signal DATA, the latch 55 latches an output signal Q and an inverted output signal QB of the same logic value.

A data receiver may include first and second folded voltage sense amplifiers 50 which respectively receive the output signals of the first pre amplifier 30 and the output signals of the second pre amplifier 40. In this case, it is possible to allow the first folded voltage sense amplifier to detect even-numbered bits among the data input into the data receiver in response to a first edge (for example, a rising edge) of the clock signal CLK, and allow the second folded voltage sense amplifier to detect odd-numbered bits in response to a second edge (for example, a falling edge) of the clock signal CLK.

The data receivers 100 and 200 according to the embodiments of the present invention can stably detect data by receiving the data and differential reference signals. In other words, the data receivers 100 and 200 can stably detect data using a differential signal at high speed using only one data line.

For example, in the case of receiving 16-bit data at high speed, a data receiver using a differential signal needs 32 signal lines. However, the data receiver according to the present invention can produce the same effects using only two differential signal lines and 16 data lines.

In addition, according to the present invention, it is possible to decrease the power consumption and layout area of the data receiver. Since the data receiver of the present invention operates in synchronization with a clock signal, it is possible to stably detect data at high speed even at a high frequency. In addition, even when there is not much difference between signals input into a folded voltage sense amplifier, and a process, voltage, or temperature varies, it is still possible to precisely detect data.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A receiver comprising:
   an amplifier which compares differential reference signals with input data and outputs first differential signals based on a result of the comparison; and
   a folded differential voltage sensor which amplifies the difference between the first differential signals in synchronization with a clock signal and detects the input data.

2. The receiver of claim 1, wherein the differential reference signals are one of either direct current (DC) signals or oscillating signals.

3. The receiver of claim 1, wherein the folded differential voltage sensor comprises:
   a sensor which senses the difference between the first differential signals in synchronization with the clock signal and outputs second differential signals based on results of the sensing;
   an amplifier which precharges voltage levels of first and second nodes to a power supply voltage, amplifies the difference between the second differential signals to generate third differential signals, and outputs the third differential signals to the first and second nodes; and
   a latch which latches the output signal of the first node and the output signal of the second node.

4. The receiver of claim 1, wherein the amplifier comprises:
   a first preamplifier to compare a first one of the differential reference signals with the input data and output a first one of the first differential signals based on a result of the first comparison; and
   a second preamplifier to compare a second one of the differential reference signals with the input data and output a second one of the first differential signals based on a result of the second comparison.

5. A receiver comprising:
   a differential amplifier which compares differential reference signals input via a first transmission line and a second transmission line with data input via a third transmission line and outputs first differential signals based on the results of the comparison; and a folded differential voltage sampler which amplifies the difference between the first differential signals in synchronization with a clock signal and samples the data.

6. The receiver of claim 5, wherein the differential reference signals are one of either direct current (DC) signals or oscillating signals.

7. The receiver of claim 5, wherein the folded differential voltage sampler comprises:

a sensor which senses the difference between the first differential signals in synchronization with the clock signal and outputs second differential signals based on results of the sensing;

an amplifier which precharges the levels of first and second nodes to a power supply voltage in synchronization with the clock signal, amplifies the difference between the second differential signals to generate third differential signals, and outputs the third differential signals to the first and second nodes; and a latch which latches the output signal of the first node and the output signal of the second node.

8. The receiver of claim 5, wherein the differential amplifier comprises:

a first preamplifier to compare a first one of the differential reference signals input via the first transmission line with the data input via the third transmission line and output a first one of the first differential signals based on a result of the first comparison; and a second preamplifier to compare a second one of the differential reference signals input via the second transmission line with the data input via the third transmission line and output a second one of the first differential signals based on a result of the second comparison.

9. A receiver comprising:

a first differential amplifier which compares a first reference signal with input data and outputs first differential signals based on results of the comparison;

a second differential amplifier which compares a second reference signal with the input data and outputs second differential signals based on results of the comparison; and a folded differential voltage sense amplifier which amplifies the difference between at least one of the first differential signals and the second differential signals in synchronization with a clock signal to detect the input data, wherein the first and second reference signals are differential signals.

10. The receiver of claim 9, wherein the first reference signal is input into a first input port of the first differential amplifier via a first transmission line, the second reference signal is input into a first input port of the second differential amplifier via a second transmission line, and the input data is input into a second input port of the first differential amplifier and a second input port of the second differential amplifier via a third transmission line.

11. The receiver of claim 9, wherein the folded differential voltage sense amplifier comprises:

a sensor which senses the difference between at least one of the first differential signals and the second differential signals in synchronization with the clock signal and outputs third differential signals based on the results of the sensing;

an amplifier which precharges voltage levels of first and second nodes to a power supply voltage in synchronization with the clock signal, amplifies the difference between the third differential signals to generate fourth differential signals, and outputs the fourth differential signals to the first and second nodes; and a latch which latches the output signal of the first node and the output signal of the second node.

12. A method for receiving data comprising:

comparing differential reference signals with input data and outputting first differential signals based on the results of the comparison; and detecting the input data by amplifying the difference between the first differential signals in synchronization with a clock signal.

13. The method of claim 12, wherein detecting the input data comprises:

sensing the difference between the first differential signals in synchronization with the clock signal and outputting second differential signals based on results. of the sensing;

precharging voltage levels of first and second nodes to a power supply voltage in synchronization with the clock signal, amplifying the difference between the second differential signals to generate third differential signals, and outputting the third differential signals to the first and second nodes; and latching an output signal of the first node and an output signal of the second node.

14. A method for receiving data comprising:

comparing differential reference signals input via a first transmission line and a second transmission line with the data input via a third transmission line and outputting first differential signals based on the results of the comparison; and sampling the data by amplifying the difference between the first differential signals in synchronization with a clock signal.

15. The method of claim 14, wherein sampling the data comprises:

sensing the difference between the first differential signals in synchronization with the clock signal and outputting second differential signals based on results of the sensing;

precharging voltage levels of first and second nodes to a power supply voltage in synchronization with the clock signal, amplifying the difference between the second differential signals to generate third differential signals, and outputting the third differential signals to the first and second nodes; and latching an output signal of the first node and an output signal of the second node.

* * * * *

UNITED STATES PATENT AND TRADEMARK OFFICE
CERTIFICATE OF CORRECTION

| | | |
|---|---|---|
| PATENT NO. | : 7,394,872 B2 | Page 1 of 1 |
| APPLICATION NO. | : 10/205646 | |
| DATED | : July 1, 2008 | |
| INVENTOR(S) | : Byong-Mo Moon | |

It is certified that error appears in the above-identified patent and that said Letters Patent is hereby corrected as shown below:

Column 9, line 42, the word "NODS" should read -- NOD5 --.

Signed and Sealed this

Twenty-first Day of October, 2008

JON W. DUDAS
*Director of the United States Patent and Trademark Office*